(12) United States Patent
Roozeboom et al.

(10) Patent No.: US 9,000,808 B2
(45) Date of Patent: Apr. 7, 2015

(54) INPUT PIN STATE DETECTION CIRCUIT AND METHOD THEREFOR

(75) Inventors: Dominicus M. Roozeboom, San Jose, CA (US); Sharad Murari, Gilbert, AZ (US); Harold Garth Hanson, Queen Creek, AZ (US)

(73) Assignee: NXP B.V., Eindhoven (NL)

( * ) Notice: Subject to any disclaimer, the term of this patent is extended or adjusted under 35 U.S.C. 154(b) by 829 days.

(21) Appl. No.: 12/790,362

(22) Filed: May 28, 2010

(65) Prior Publication Data

US 2011/0291704 A1    Dec. 1, 2011

(51) Int. Cl.
*H03K 5/153* (2006.01)
*H03K 19/173* (2006.01)
*H03M 1/36* (2006.01)

(52) U.S. Cl.
CPC ..................................... *H03M 1/365* (2013.01)

(58) Field of Classification Search
USPC .................................. 327/74–76; 326/37–38
See application file for complete search history.

(56) References Cited

U.S. PATENT DOCUMENTS

| | | | |
|---|---|---|---|
| 6,477,205 B1 * | 11/2002 | Doblar et al. | 375/259 |
| 6,611,222 B1 | 8/2003 | Murphy | |
| 7,061,421 B1 | 6/2006 | Xiao | |
| 7,138,824 B1 * | 11/2006 | Bakker et al. | 326/32 |
| 7,138,842 B2 | 11/2006 | Padhye et al. | |
| 7,245,148 B2 * | 7/2007 | Awalt et al. | 326/38 |
| 7,486,106 B1 | 2/2009 | Camarota | |
| 8,045,353 B2 | 10/2011 | Bansal | |
| 8,129,969 B1 | 3/2012 | Chui et al. | |

FOREIGN PATENT DOCUMENTS

JP        61066590 A    4/1986
JP         8190963 A    7/1996

OTHER PUBLICATIONS

Extended European Search Report, Oct. 6, 2011, EPO.

* cited by examiner

*Primary Examiner* — Kenneth Wells

(57) ABSTRACT

A state-detection circuit facilitates the detection of the state of an input pin relative to several different types of input circuits. According to an example embodiment, a state-detection circuit includes a plurality of comparators and circuit components, configured to provide a plurality of binary output signals that collectively indicate a state of an input pin to which the comparators are coupled. The state-detection circuit is configured to facilitate the detection of several different types of input circuits, based upon the binary output signals.

20 Claims, 9 Drawing Sheets

INPUT PIN STATE DETECTION CIRCUIT AND METHOD THEREFOR

Many early electronic circuits and related systems incorporated two or more levels of logic, some with complete variability, using analog inputs and outputs. As digital systems were introduced and increased in capability (e.g., storage, speed, input/output capabilities), binary inputs and outputs were used. Modern system communications have since evolved to using digital signals, including static configuration and other static information signals.

In many applications, circuits desirably operate using different types of inputs, and under different operational conditions. For such circuits, it has often been necessary to use redundant components, such as input pins, for connecting to different types of input circuits.

In many circuit applications, compact size and efficiency are highly desirable. For example, as relative to many applications including those involving programmable circuits requiring or benefiting from operation with different types of input circuits, it is often desirable to package circuits in small areas for implementation with relatively compact devices. In addition, reducing the required size of circuits can be helpful for cost reduction.

Many circuits are not readily amenable to compact arrangements and efficient manufacture and operation. For example, many circuits are desirably applicable for implementation with a wide variety of different types of devices. To do so, such circuits must be configurable for specific operational characteristics. Unfortunately, this configurability can introduce added complexity and cost to the circuits.

These challenges can make it difficult to achieve desirable circuit and package sizes while also ensuring proper circuit operation.

In connection with various example embodiments, an input circuit facilitates various configurations, in a manner that addresses challenges for a variety of applications and devices, such as those discussed above.

In connection with an example embodiment, an input state detection circuit includes an input pin configured for receiving signals generated by a plurality of different types of input circuits, and a state-detection circuit configured to provide an output characterizing the state of the input pin for a plurality of input states respectively corresponding to the different types of input circuits. The state-detection circuit includes a plurality of comparators respectively having their high-level inputs directly coupled to the input pin, having their low-level inputs coupled between a power source and a ground node, and configured to provide a binary output that, when collectively processed with the binary outputs of the other comparators, indicates the state of the input pin. A resistor circuit is connected in series between a first one of the comparators and the power source. Resistor circuits are also coupled between each pair of comparators having input pins connected in series, and another resistor circuit is connected between a last one of the comparators and the ground node. A negative-feedback operational amplifier has an output connected to the high-level input of the comparators, a high-level input, a low-level input and a feedback circuit connecting the output to the low-level input. A resistor circuit is connected between the high-level input of the negative-feedback operational amplifier and a feedback power source. Another resistor circuit is connected between the high-level input of the negative-feedback operational amplifier and a feedback ground node.

Another example embodiment is directed to a configurable input circuit for operating in accordance with a plurality of different input circuits. The input circuit includes an input pin to receive an input signal, a state-detection circuit, a decoder circuit and a control circuit. The state-detection circuit is configured to, upon start-up of the configurable input circuit, provide a binary output signal for determining a state characteristic of the input signal, the state detection circuit having an output that provides at least N−1 output values that make up the binary output signal, the output signal being responsive to the state of the input pin and exclusive for each of N different types of input circuits. The decoder circuit is configured to decode the binary output to determine the state of the input pin and a type of input circuit corresponding to the determined state. The control circuit is configured to power-on the state-detection circuit upon startup of the configurable input circuit, to power-off the state-detection circuit in response to the decoder circuit determining the state of the input signal, and to configure the input circuit for operation based upon the determined state of the input pin.

Another example embodiment is directed to a method for operating an input circuit. An input signal is received at an input pin, and in response to a startup condition, a state-detection circuit is powered to provide a binary output signal for determining a state characteristic of the input signal. The state detection circuit is used to provide an output having at least N−1 output values that make up the binary output signal, the output signal being responsive to the state of the input pin and exclusive for each of N different types of input circuits. In a decoder circuit, the binary output is decoded to determine the state of the input pin and a type of input circuit corresponding to the determined state. In response to determining the state of the input signal, the state-detection circuit is powered off.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
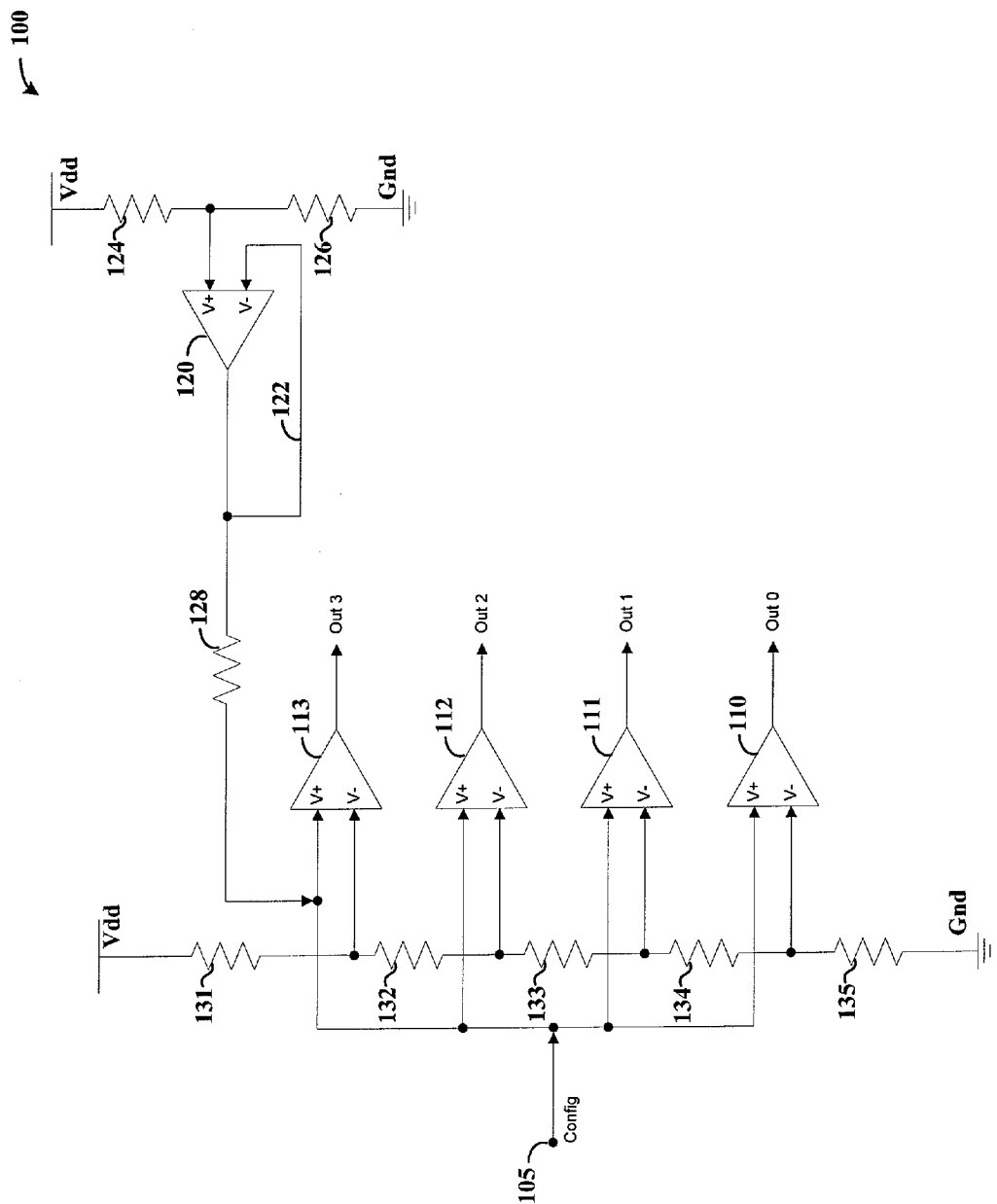
FIG. 1 shows a quinary input circuit, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of input circuits, programmable chips, devices and related arrangements. While the present invention is not necessarily so limited, various aspects of the invention may be appreciated through a discussion of examples using this context.

In connection with various example embodiments, a binary-type input pin state circuit is configured to generate a plurality of different output values based upon an input signal as received at a single input pin. The input state circuit includes a set of comparators configured and connected to generate the output values as an indication of the configuration of an input circuit via which the input signal is presented.

The combination of output values facilitates the detection of several (e.g., 3, 5 or more) different types of input circuits, by providing different and distinct combinations of output values for input signals received from each type of input circuit. The connectivity of the comparators and related circuitry (e.g., a resistor tree divider) can be set based upon the desired number of different types of input circuits to be detected. In different embodiments, combinations of resistors, shorts, ties to a reference/supply voltage (e.g., Vdd) or to ground are used with the comparators to set the combination of outputs from the respective comparators for use in detecting the type of input circuit.

The output states of the respective comparators can be used to set the configuration of one or more circuits that use the input circuit (and signals presented via the input circuit) for subsequent processing. For example, where an input pin can be connected to a variety of different types of input circuits, the signal presented at the input pin is processed via the input state circuit, which generates output values (e.g., a series of high and low values corresponding to logical ones or zeros). The combination of output values can be used together with a known configuration of the input state circuit and its comparators, or simply using a lookup table, to detect a type of the input circuit.

Input circuits detectable using this approach may include, for example, circuits presenting a short to ground, resistor to ground, open, resistor to reference voltage, and short to a reference voltage, combinations thereof, or other circuits. Once the type of input circuit is detected, the resulting detection can be used in operation of the input circuit for subsequent processing.

These approaches can further be used iteratively for a particular circuit, to detect the type of several different input circuits for a particular device. In some instances, several input state circuits are used to detect the state of various input pins, and the corresponding type of input circuit present at the respective pins. In other instances, an input state circuit is used to detect the type of input circuit present at different input pins, and a switch-type circuit is used to selectively connect different input circuits to the input state circuit, with the outputs from the input state circuits respectively provided and used to detect/set the state of the respective input pins.

The input state circuit can be used to provide an indication of the type of input circuit connected to the input state circuit at various stages of operation and under differing conditions, depending upon the application. In some implementations, the input state circuit is powered upon startup of an input circuit, used to detect the type of the input circuit, and then powered down to conserve energy as the input circuit is subsequently used for processing.

In other implementations, the input state circuit is powered upon an initial startup of the input circuit, used to generate output values for detecting the type of the input circuit connected to an input pin of the input state circuit, then powered down until an event or condition is satisfied. The detected type of the input circuit is stored or otherwise preserved such that the type is known and used over time. With this approach, the type of the input circuit can be set and used over various shut-down and start-up cycles or long periods of operation. When a condition such as a reset condition is encountered, the input state circuit is powered again and used to re-generate the plurality of output values from a new input signal, using the comparators. Once the new input signal is processed for detecting the type of input circuit providing the signal, the input state circuit is again powered down.

In the above-discussed exemplary embodiments, the input state circuit can be powered in various contexts. In many implementations, the input state circuit is generally passive, and operates based upon sampling of a signal at the input pin. Accordingly, powering the input state circuit off may involve simply disconnecting the circuit from the input pin and/or Vdd as appropriate.

The input state circuit can be used in a variety of different types of circuits. For example, the input state circuit can be used as a stand-alone circuit, as an add-on type of circuit, or integrated with other circuits. Accordingly, the input state circuit may include one or more additional circuits as appropriate to suit various applications.

Other example embodiments are directed to a decoder circuit including an input state circuit such as described above, as well as a decoder circuit that decodes the outputs of the input state circuit and provides an output that is used to facilitate the operation of circuitry using the input circuit. In some instances, the decoder circuit defines the type of the input circuit connected to the input state circuit and provides an output that can be interpreted for identifying the type of the input circuit. In other instances, the decoder circuit generates an output or outputs that set or sets certain operational characteristics of a circuit connected to the input circuit, based upon the detected type of input circuit (e.g., a series of switches or other connections can be controlled, based upon the decoded signal and corresponding detected type of the input circuit).

Still other embodiments are directed to integrated circuits having a plurality of circuits and devices, including an input state circuit (such as described above) that is configured and connected to provide outputs for detecting a type of input circuit connected to a single input pin, a decoder circuit for decoding the outputs, and circuitry that operates with the input circuit. Such circuits may include, for example, those used in integrated circuit chips, mixed-signal circuits, computers and mobile devices. The output of the decoder is used in configuring the integrated circuit based upon the type of input circuit connected to the input pin.

As discussed above, a variety of different types and combinations of input circuits can be detected using an input state detection such as described herein, with comparators connected using different combinations of circuits (e.g., resistors, shorts and connectivity to Vdd and ground) to provide an appropriate combination of outputs based upon characteristics of the input circuit connected to the input pin. The following discussion of FIG. 1 and the exemplary outputs and corresponding input pin state (and corresponding input circuit type) are applicable for use with a quinary input circuit by way of example. However, these approaches are applicable to implementation with a variety of example embodiments, in different configurations, to provide binary outputs to characterize the state of an input pin and a corresponding type (of several types) of an input circuit connected thereto.

Turning to FIG. 1, a quinary input state detection circuit 100 is configured to provide binary outputs to characterize a type of input circuit connected to an input pin 105, in accordance with another example embodiment of the present invention. The state detection circuit 100 includes a plurality of comparators including comparators 110-113 that respectively provide binary outputs 0-3, which collectively provide an indication of the state of the input pin 105 via the signal received thereat. This state corresponds to a type of input circuit coupled to the input pin 105.

The input pin 105 is connected to the high voltage (V+) input terminals of the comparators 110-113, as well as to the output of a negative-feedback operational amplifier 120 and its low (V−) input terminals via feedback loop 122. The high input terminal of operational amplifier 120 is coupled to Vdd via resistor circuit 124, and the low input terminal of operational amplifier 120 is coupled to ground via resistor circuit 126.

The low input terminals of comparators 110-113 are coupled between Vdd and ground, with resistor circuits between the connections. Specifically, resistor circuit 131 is coupled between Vdd and the low input terminal of comparator 113, resistor circuit 132 is coupled between the low input terminals of comparators 113 and 112, resistor circuit 133 is coupled between the low input terminals of comparators 112 and 111, resistor circuit 134 is coupled between the low input terminals of comparators 111 and 110, and resistor circuit 135 is coupled between the low input terminal of comparator 110 and ground.

The input state detection circuit 100 accordingly provides binary outputs (e.g., bits) at each of outputs 0-3, at comparators 110-113, to indicate a type of input circuit coupled to the input pin 105. In connection with various embodiments, the input state detection circuit 100 is connected and operated to provide outputs as shown in the Quinary Input Truth Table of Table 1. The input state in Table 1 represents the connectivity of the input pin 105, relative to a type of circuit connected thereto. Each of the outputs 0-3 is reflective of the corresponding binary output values of each of the comparators 110-113.

TABLE 1

Quinary Input Truth Table

| Input State | Out<3> | Out<2> | Out<1> | Out<0> | State |
|---|---|---|---|---|---|
| Short to Ground | 0 | 0 | 0 | 0 | 1 |
| R to Ground | 0 | 0 | 0 | 1 | 2 |
| Open | 0 | 0 | 1 | 1 | 3 |
| R to Vdd | 0 | 1 | 1 | 1 | 4 |
| Short to Vdd | 1 | 1 | 1 | 1 | 5 |

The indicated state in Table 1 is exemplary with this state being named or otherwise characterized to facilitate the particular application in which the input state detection circuit is implemented. Here, the connection of the input pin 105 via short to ground is indicated as state 1; the connection of the input pin 105 via a resistor to ground is indicated as state 2; the connection of the input pin 105 to an open circuit is indicated as state 3; the connection of the input pin 105 via a resistor to Vdd is indicated as state 4; and the connection of the input pin 105 via short to Vdd is indicated as state 5. In addition, by detecting the values at respective outputs in sequential combinations of resistors (e.g., starting with output 3), detecting a value of "1" at a particular output can be used to discern that the remaining outputs (in descending order) also have a value of "1."

In connection with many example embodiments, the input state detection circuit 100 may further include or otherwise provide an output indicative of the state of the pin 105 as shown in Table 1. For example, a decoder circuit can be implemented with or as part of the input state detection circuit 100, and used to generate an output indicative of the state number as shown. Similarly, a decoder circuit can also be implemented to generate an output that configures one or more circuits using the input circuit coupled to the input pin 105 under operational conditions.

Various configurations can be achieved using different numbers of input pins. For example, Table 2 shows a number of input pins used to achieve different configurations, relative to the number of states:

TABLE 2

| | Pin Configuration | | | |
|---|---|---|---|---|
| No. of | Number of Pins | | | |
| Configurations | 2 states/pin | 5 states/pin | 10 states/pin | 16 states/pin |
| 10 | 4 | 2 | 1 | 1 |
| 125 | 7 | 3 | 3 | 2 |
| 625 | 10 | 4 | 3 | 3 |
| 3125 | 12 | 5 | 4 | 3 |

These respective configurations can be implemented with the circuits shown in the Figures, such as with FIG. 1, and various modifications to include additional (e.g., comparable) circuits to provide two or more input pins and related comparators to facilitate additional states and configurations (e.g., in detecting five states with a single pin, 25 configurations are programmable with two pins).

FIGS. 2-6 show example input circuits that may be implemented in connection with the example embodiments described herein, including those shown in and described in connection with FIG. 1. For example, the input chips shown in each respective figure may be implemented using an input state detection circuit as shown in FIG. 1, or a combination of such circuits with additional circuitry, such as for decoding the binary outputs or operating with the input circuits.

Figure 2:
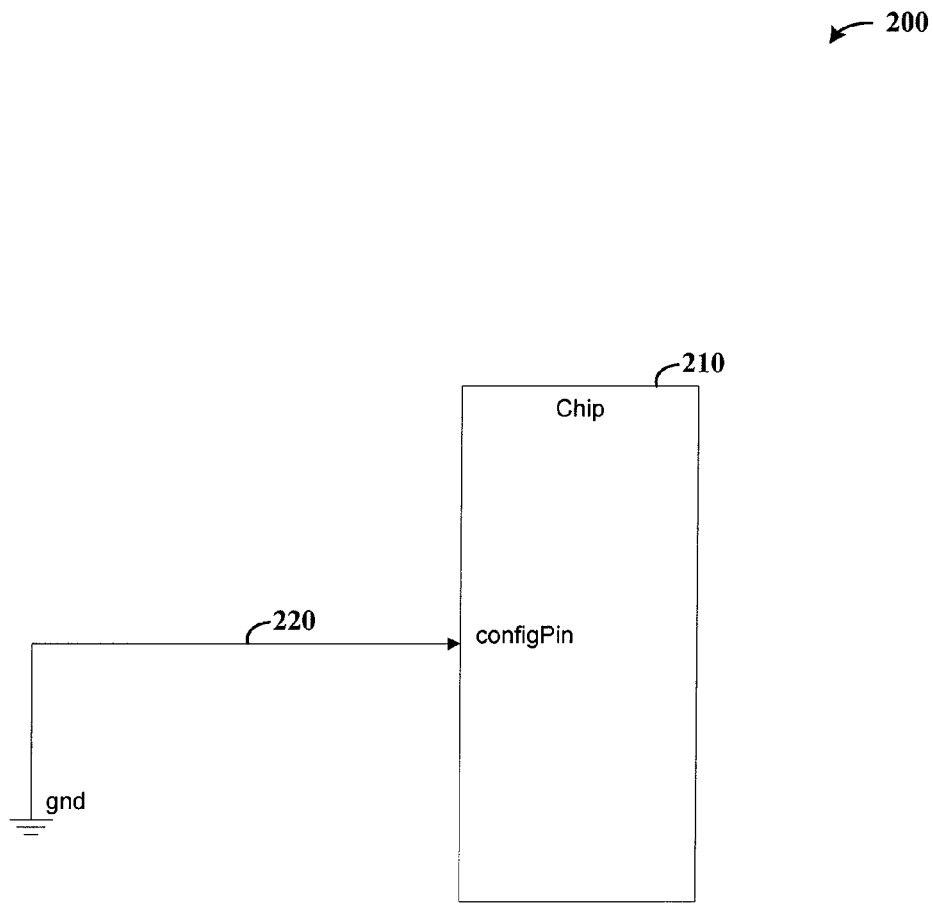
FIG. 2 shows an input pin circuit arrangement having an input connection to ground, according to another example embodiment of the present invention.

Beginning with FIG. 2, an input pin circuit arrangement 200 includes a chip 210 and an input circuit 220 connected to ground, in connection with another example embodiment of the present invention. When used with the input state detection circuit 100 of FIG. 1, the input circuit 220 connects the input pin 105 to ground, and thus effectively couples the input pins of the respective comparators 110-113 (as well as the output of operational amplifier 120, via resistor 128) to ground, setting the outputs of the comparators 110-113 to zero as shown in Table 1 for state 1.

Figure 3:
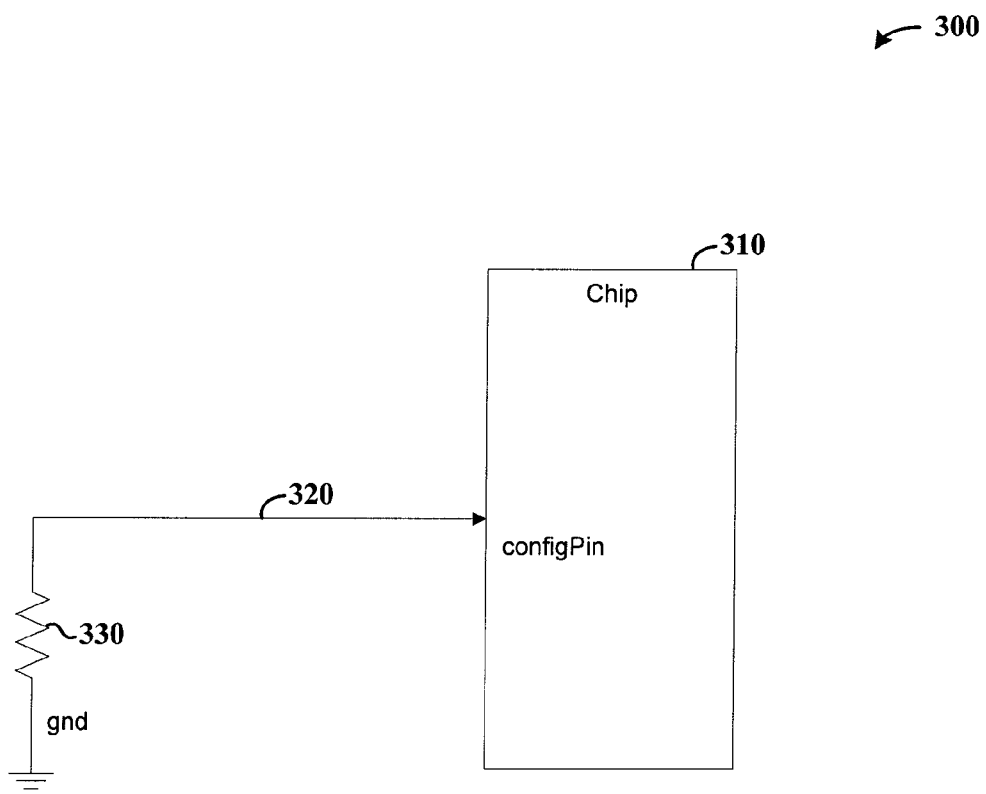
FIG. 3 shows an input pin circuit arrangement having an input connection to ground through a resistor, according to another example embodiment of the present invention.

FIG. 3 shows an input pin circuit arrangement 300 including a chip 310 and an input circuit 320 connected to ground through a resistor 330, according to another example embodiment of the present invention. When connected to input 105 of the input state detection circuit 100 (as part or all of chip 310), the input circuit 320 connects the respective high level inputs of the comparators 110-113 (as well as the output of operational amplifier 120) to ground via the resistor 330. The outputs of comparators 111-113 are correspondingly set to zero, and the output of comparator 113 is set to 1, as shown in Table 1 for state 2.

Figure 4:
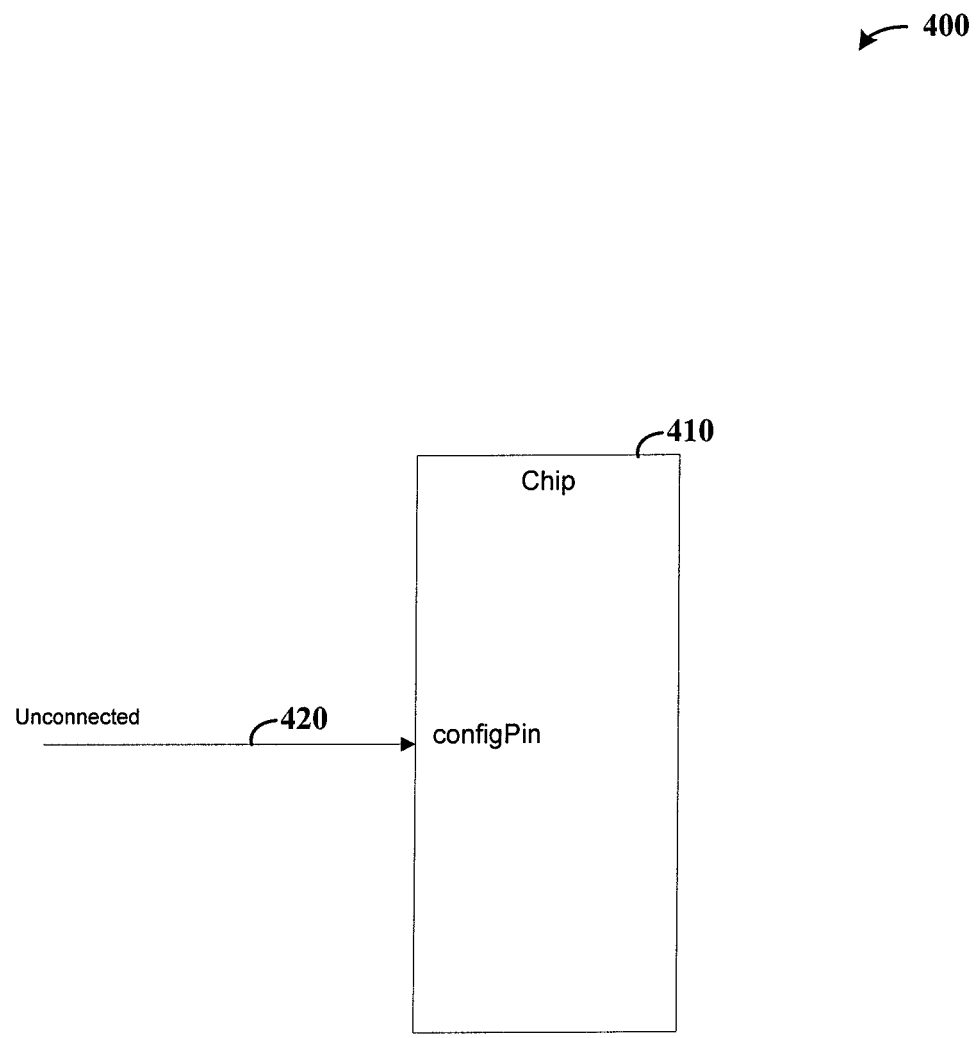
FIG. 4 shows an input pin circuit arrangement having an input connection to an open circuit, according to another example embodiment of the present invention.

FIG. 4 shows an input pin circuit arrangement 400 including a chip 410 and an input circuit 420 that is an open circuit, according to another example embodiment of the present invention. When connected to input 105 of the input state detection circuit 100 (as part or all of chip 410), the input circuit 420 connects the respective high level inputs of the comparators 110-113 to an open circuit, resulting in the input connectivity of the respective comparators being tied to the output of operational amplifier 120. The outputs of comparators 110-113 are correspondingly set as shown for respective outputs 0-3 in Table 1 for state 3.

Figure 5:
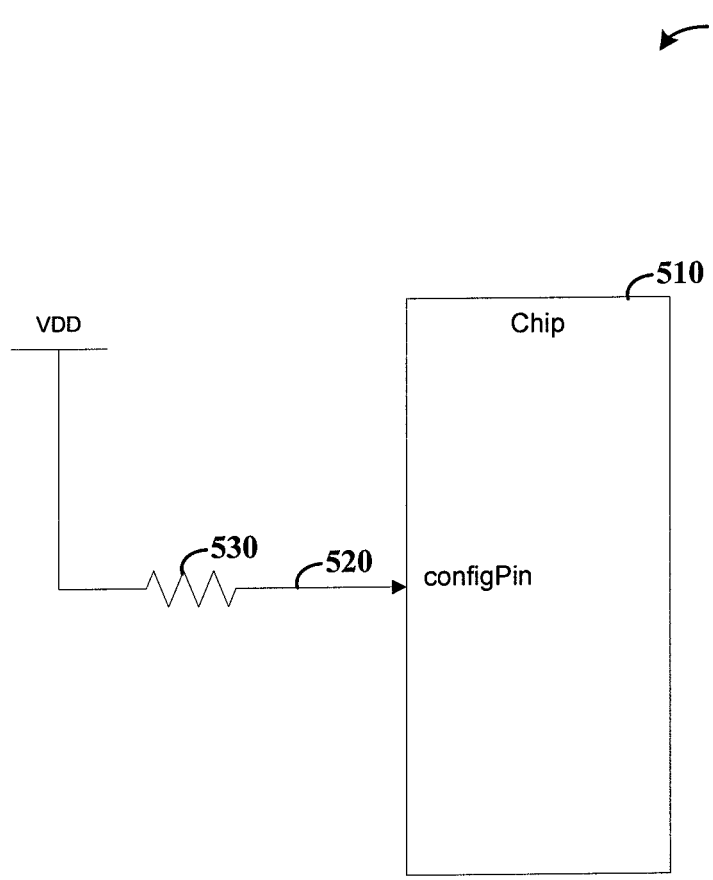
FIG. 5 shows an input pin circuit arrangement having an input connection to VDD through a resistor, according to another example embodiment of the present invention.

FIG. 5 shows an input pin circuit arrangement 500 including a chip 510 and an input circuit 520 connected to VDD through a resistor 530, according to another example embodiment of the present invention. When connected to input 105 of the input state detection circuit 100 (as part or all of chip 510), the input circuit 520 connects the respective high level inputs of the comparators 110-113 to Vdd via resistor 530. The outputs of comparators 110-113 are correspondingly set as shown for respective outputs 0-3 in Table 1 for state 4.

Figure 6:
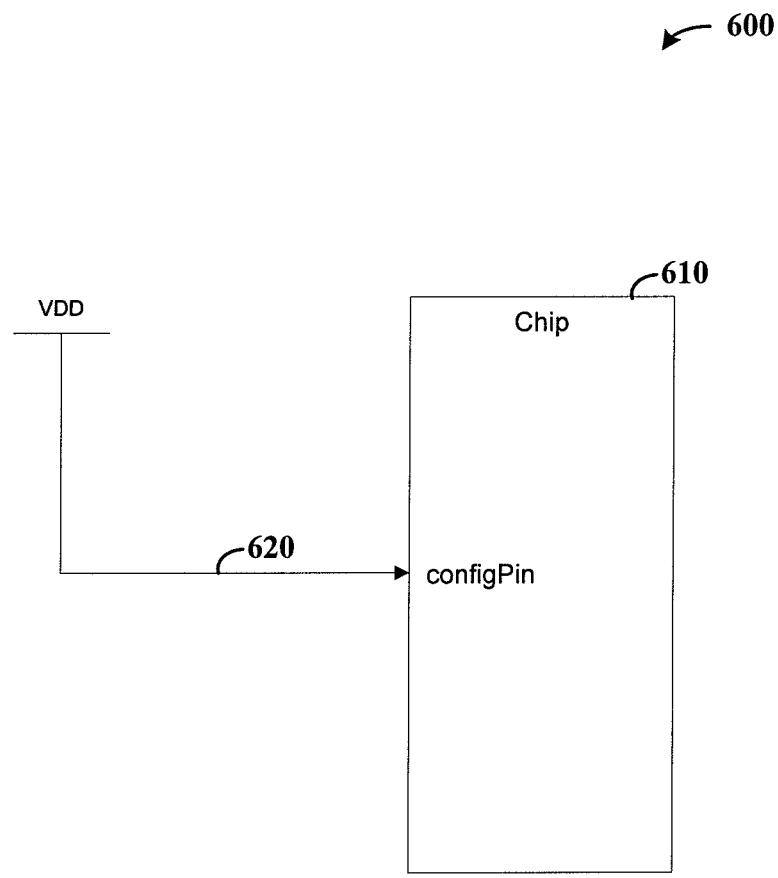
FIG. 6 shows an input pin circuit arrangement having an input connection to VDD, according to another example embodiment of the present invention.

FIG. 6 shows an input pin circuit arrangement 600 including a chip 610 and an input circuit 620 connected to VDD, according to another example embodiment of the present invention. When connected to input 105 of the input state detection circuit 100 (as part or all of chip 610), the input circuit 620 connects the respective high level inputs of the comparators 110-113 directly to Vdd. The outputs of comparators 110-113 are correspondingly set as shown for respective outputs 0-3 in Table 1 for state 5.

As relevant to the embodiments shown in FIGS. 1-6, the values of the resistors in the circuit shown in FIG. 1, can be set relative to the expected types of circuits to be detected at the input pin 105. For example, the resistor tree structure as shown can be configured to detect connection to Vdd or ground, respectively relative to such connection as made via a short or resistor, the presence of a resistor in the circuit. Accordingly, the respective values of the resistors in the circuit 100 may be set based upon an expected use as may relate to a type of resistor, power supply and/or other condition, to facilitate a binary output (e.g., as in Table 1) that represents the detection of both ground and Vdd connectivity with and without a resistor in the circuit.

Figure 7:
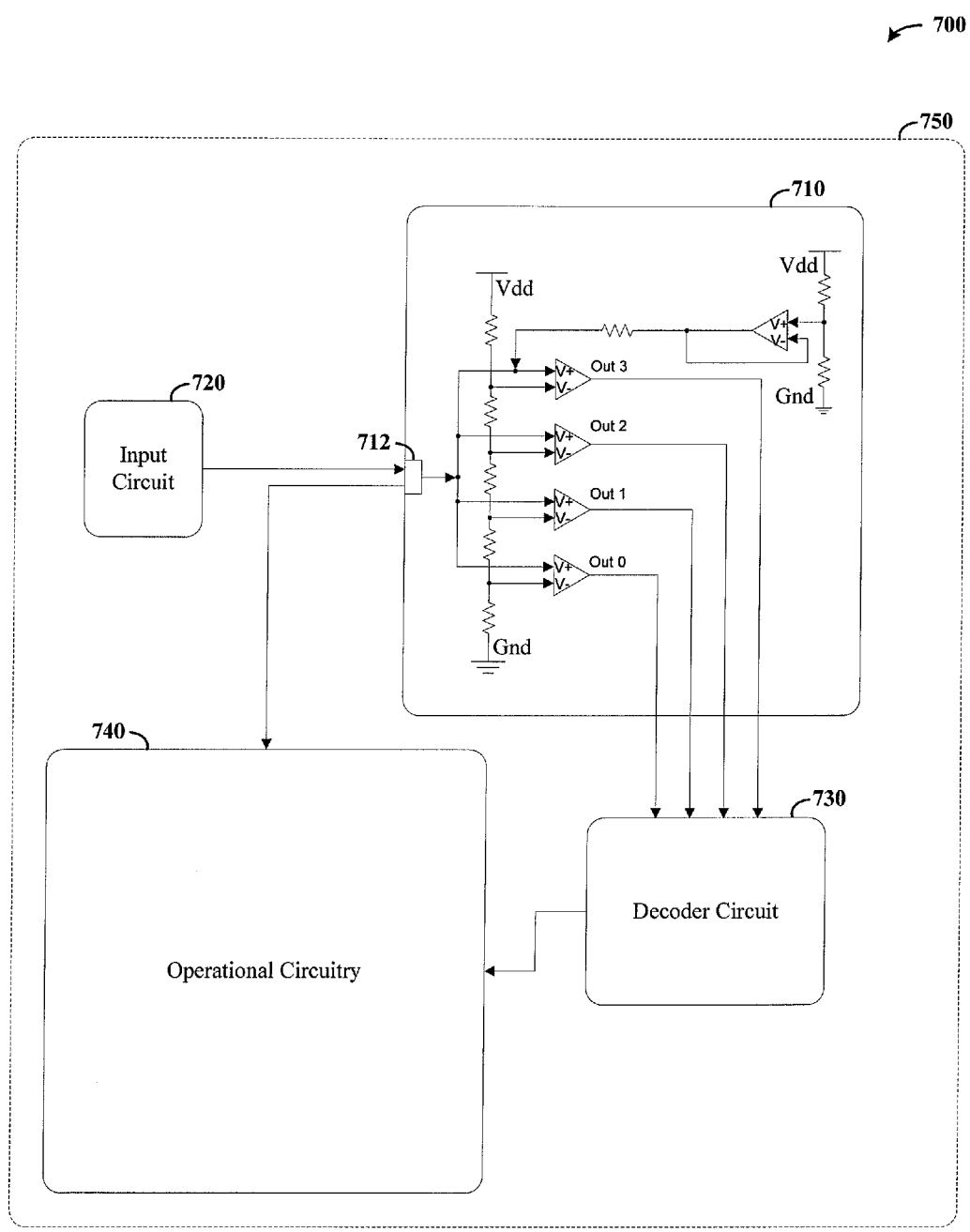
FIG. 7 shows a circuit arrangement including an input circuit, input pin state detection circuit, decoder and operational circuitry, in accordance with other example embodiments of the present invention.

FIG. 7 shows a circuit arrangement 700 including an input state detection circuit 710 coupled at a single input pin 712 to an input circuit 720 (or selectively to a plurality of such circuits), in accordance with other example embodiments of the present invention. The circuit arrangement 700 further includes a decoder circuit 730 and operational circuitry 740 (e.g., one or more circuits that operate with the input circuit 720). The respective state detection circuit 710, input circuit 720, decoder circuit 730 and operational circuitry 740 may be implemented in one or more common circuits, with an integrated circuit chip 750 shown by way of example.

As discussed above, the decoder circuit 730 may be integrated with the state detection circuit 710. The decoder circuit 730 is coupled to receive the outputs of comparators in the state detection circuit 710, and to use outputs to determine the type of the input circuit 720. For example, where the state detection circuit 710 is used to detect the connectivity of input circuits as shown in FIGS. 2-6, the outputs can be analyzed in a manner commensurate with the approach shown in and described in connection with Table 1. This determined type is then used, directly by the decoder circuit and/or by other circuitry (740) to control one or more of the connectivity and/or implementation of the input circuit 720.

Figure 8:
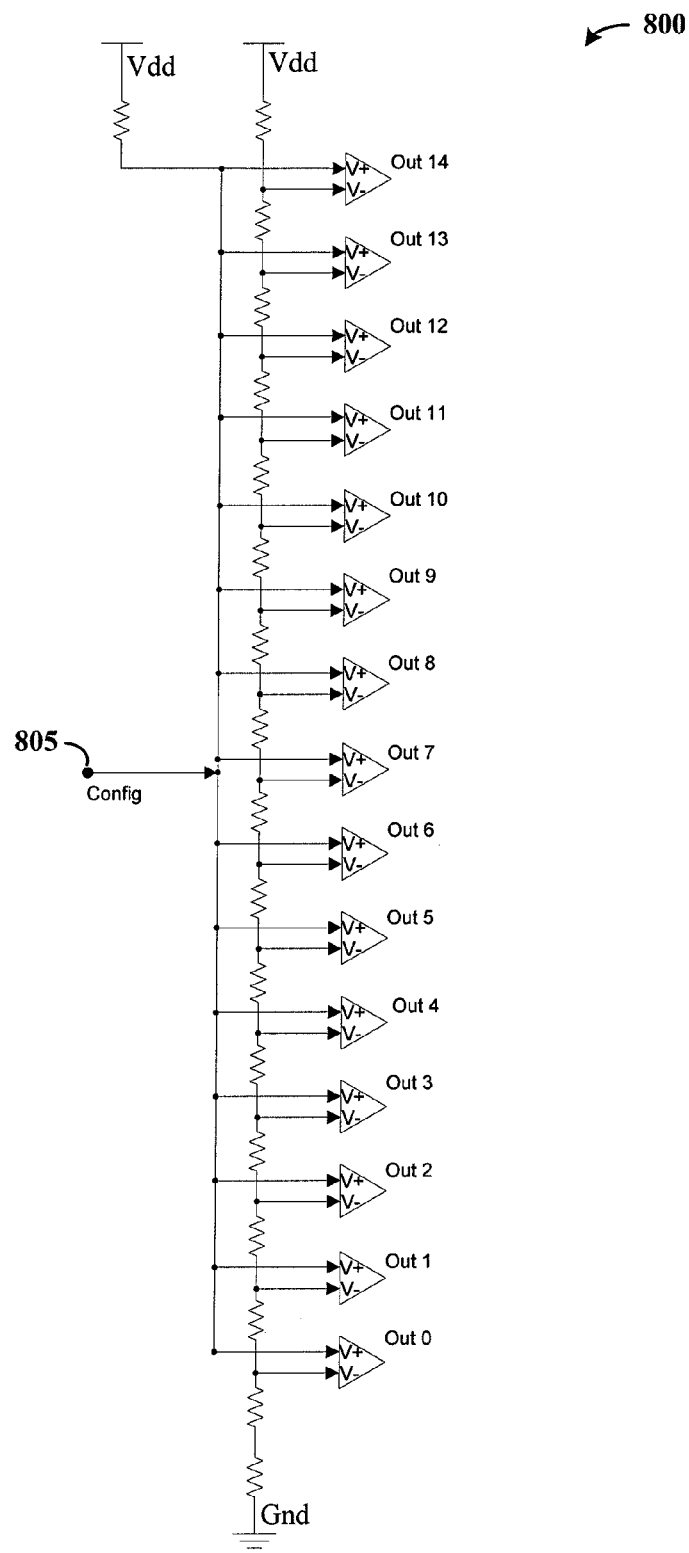
FIG. 8 shows a 16 state per pin input circuit, in accordance another example embodiment of the present invention.

As discussed above, various numbers of comparators can be used for detecting different combinations of states available at an input pin (or pins). FIG. 8 shows another such approach, similar to that shown in FIG. 1, involving a circuit 800 that is configured to provide 16-state per pin detection, in accordance with various embodiments. An input signal received at an input pin 805 is used via comparator/outputs 0-14 to provide 16 states as follows in Table 3:

TABLE 3

16-State Input Table

| Input R to gnd | Output | | | | | | | | | | | | | | | State |
|---|---|---|---|---|---|---|---|---|---|---|---|---|---|---|---|---|
| | 14 | 13 | 12 | 11 | 10 | 9 | 8 | 7 | 6 | 5 | 4 | 3 | 2 | 1 | 0 | |
| 0 | 0 | 0 | 0 | 0 | 0 | 0 | 0 | 0 | 0 | 0 | 0 | 0 | 0 | 0 | 0 | 0 |
| 5k | 0 | 0 | 0 | 0 | 0 | 0 | 0 | 0 | 0 | 0 | 0 | 0 | 0 | 0 | 1 | 1 |
| 10k | 0 | 0 | 0 | 0 | 0 | 0 | 0 | 0 | 0 | 0 | 0 | 0 | 0 | 1 | 1 | 2 |
| 15k | 0 | 0 | 0 | 0 | 0 | 0 | 0 | 0 | 0 | 0 | 0 | 0 | 1 | 1 | 1 | 3 |
| 20k | 0 | 0 | 0 | 0 | 0 | 0 | 0 | 0 | 0 | 0 | 0 | 1 | 1 | 1 | 1 | 4 |
| 25k | 0 | 0 | 0 | 0 | 0 | 0 | 0 | 0 | 0 | 0 | 1 | 1 | 1 | 1 | 1 | 5 |
| 30k | 0 | 0 | 0 | 0 | 0 | 0 | 0 | 0 | 0 | 1 | 1 | 1 | 1 | 1 | 1 | 6 |
| 35k | 0 | 0 | 0 | 0 | 0 | 0 | 0 | 0 | 1 | 1 | 1 | 1 | 1 | 1 | 1 | 7 |
| 40k | 0 | 0 | 0 | 0 | 0 | 0 | 0 | 1 | 1 | 1 | 1 | 1 | 1 | 1 | 1 | 8 |
| 45k | 0 | 0 | 0 | 0 | 0 | 0 | 1 | 1 | 1 | 1 | 1 | 1 | 1 | 1 | 1 | 9 |
| 50k | 0 | 0 | 0 | 0 | 0 | 1 | 1 | 1 | 1 | 1 | 1 | 1 | 1 | 1 | 1 | 10 |
| 55k | 0 | 0 | 0 | 0 | 1 | 1 | 1 | 1 | 1 | 1 | 1 | 1 | 1 | 1 | 1 | 11 |
| 60k | 0 | 0 | 0 | 1 | 1 | 1 | 1 | 1 | 1 | 1 | 1 | 1 | 1 | 1 | 1 | 12 |
| 65k | 0 | 0 | 1 | 1 | 1 | 1 | 1 | 1 | 1 | 1 | 1 | 1 | 1 | 1 | 1 | 13 |
| 70k | 0 | 1 | 1 | 1 | 1 | 1 | 1 | 1 | 1 | 1 | 1 | 1 | 1 | 1 | 1 | 14 |
| >75k | 1 | 1 | 1 | 1 | 1 | 1 | 1 | 1 | 1 | 1 | 1 | 1 | 1 | 1 | 1 | 15 |

The resistance value (to ground) is set based upon a normalized resistance used in the respective resistors as shown, with the values shown in Table 3 being exemplary. Different embodiments thus involve variations of these configurations, such as may be effected in accordance with Table 2 above.

Figure 9:
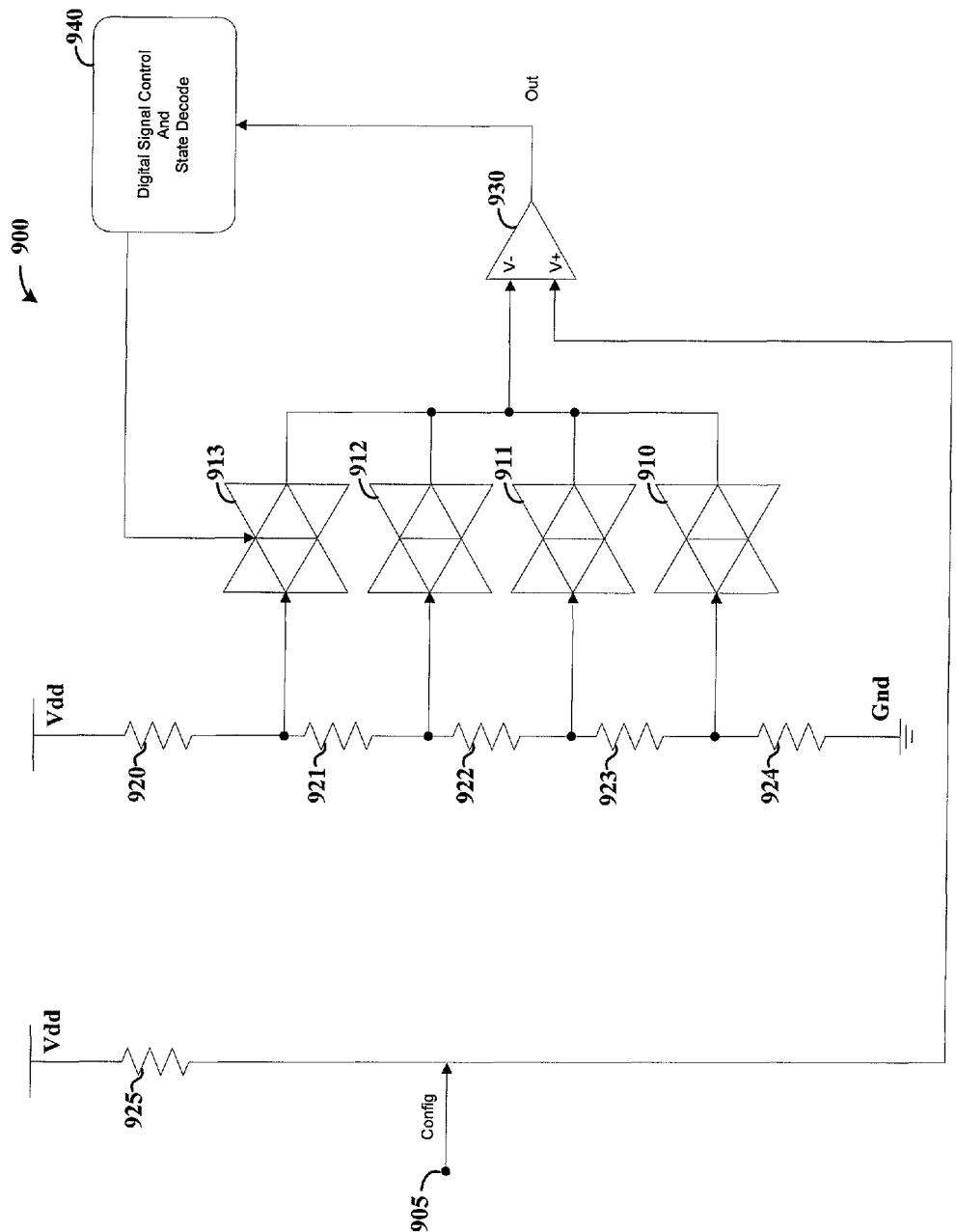
FIG. 9 shows an input pin state detection circuit having a plurality of pass gates feeding a comparator circuit, in accordance with another example embodiment of the present invention.

FIG. 9 shows an input pin state detection circuit 900 having a plurality of pass gates feeding a comparator circuit, in accordance with another example embodiment of the present invention. The circuit 900 includes an input pin 905 that receives an incoming signal, such as shown in FIGS. 2-6. A plurality of pass gates 910-913 are connected between Vdd and ground via resistors 920-924, and respectively connected to the low input of a comparator 930. The high input of the comparator 930 is connected to Vdd via resistor 925, with the input pin 905 being between the high input and the resistor.

A digital signal control/state decode circuit 940 is configured to control the pass gates 910 and 913, and further to receive and decode the output of the comparator 930 for detecting the state at the input pin 905. In some embodiments, the digital signal control and state decode functions carried out at circuit 940 are carried out using separate circuits. By controlling the pass gates 910-913, the low input of the comparator 930 can be coupled as desired between the resistors 920-924, which can be effected in a manner similar to that shown in FIG. 1, to a similar effect with fewer comparators. Accordingly, the circuit 900 can be implemented, for example, in connection with one or more of the circuits shown in FIGS. 1, 7 and 8, with the combined pass gate and comparators used to reduce the number of comparators needed.

Based upon the above discussion and illustrations, those skilled in the art will readily recognize that various modifications and changes may be made to the present invention without strictly following the exemplary embodiments and applications illustrated and described herein. For example, the input terminals as shown and discussed may be replaced with terminals of different arrangements, and different types and numbers of input configurations (e.g., involving different types of input circuits and related connectivity). In addition, resistors of various values may be used in the input state detection circuits as shown and described, together with different values of Vdd, as relative to other resistors in the circuit and/or of the input circuits of which the resulting input pin state is to be evaluated. Such modifications do not depart from the true spirit and scope of the present invention, including that set forth in the following claims.

What is claimed is:

1. An input state detection circuit comprising:
   an input pin configured for receiving signals generated by a plurality of different types of input circuits;
   a state-detection circuit configured to provide an output characterizing the state of the input pin for a plurality of input states respectively corresponding to the plurality of different types of input circuits, the state-detection circuit having
      a plurality of comparators respectively having their high-level inputs directly coupled to the input pin, having their low-level inputs coupled between a power source and a ground node, and configured to provide a binary output that, when collectively processed with the binary outputs of the other comparators, indicates the state of the input pin,
      a resistor circuit connected in series between a first one of the comparators and the power source,
      for each pair of comparators having input pins connected in series, a resistor circuit connected therebetween,
      a resistor circuit connected between a last one of the comparators and the ground node;
   a negative-feedback operational amplifier having an output connected to the high-level input of the comparators, having a high-level input, a low-level input and a feedback circuit connecting the output to the low-level input;
   a resistor circuit connected between the high-level input of the negative-feedback operational amplifier and a feedback power source; and
   a resistor circuit connected between the high-level input of the negative-feedback operational amplifier and a feedback ground node.

2. The circuit of claim 1, further including a decoder circuit coupled to the outputs of the comparators and configured to detect the state of the input pin based upon the binary outputs of the comparators and to provide the detected state for operating an integrated circuit connected to the input pin.

3. The circuit of claim 1, further including a control circuit configured to
   power on the state-detection circuit for an initialization cycle during which the state of the input pin is detected, and
   after the state of the input pin has been detected, power off the state-detection circuit and use the detected state to operate an integrated circuit connected to the input pin.

4. The circuit of claim 1, further including a control circuit configured to,
   during an initialization period, power on the state-detection circuit and detect the state of the input pin based upon the binary outputs of the comparators, and
   after the initialization period, power off the state-detection circuit and provide the detected state for operating an integrated circuit connected to the input pin.

5. The circuit of claim 1, further including a control circuit configured to,
   during an initialization period, power on the state-detection circuit and detect the state of the input pin based upon the binary outputs of the comparators,
   after the initialization period, power off the state-detection circuit and provide the detected state for operating an integrated circuit connected to the input pin,
   after operating the integrated circuit, in response to a reset event, re-power the state-detection circuit and re-detect the state of the input pin based upon the binary outputs of the comparators, and
   after re-detecting the state of the input pin, power off the state-detection circuit and provide the re-detected state for operating the integrated circuit.

6. The circuit of claim 1, wherein the state-detection circuit is configured to provide a plurality of binary output values, via the comparators, to indicate states of the input pin corresponding to input circuits that respectively couple the input pin to ground via a short, to ground via a resistor, to an open circuit, to a reference voltage via a resistor, and to a reference voltage via a short.

7. The circuit of claim 1, wherein the state-detection circuit is configured to provide different binary output values based upon the presence of a resistor coupled between the input pin and at least one of a source and ground.

8. The circuit of claim 1, further including another of the state-detection circuits connected to a second input pin, the respective state detection circuits being configured to provide respective binary output values that, when combined, provide a number of states of the input pin that is a multiple of the number of individual binary outputs for each circuit.

9. The circuit of claim 1, wherein the respective resistor circuits coupled to the inputs of the comparators have a common resistance.

10. A configurable input circuit for operating in accordance with a plurality of different input circuits, the input circuit comprising:
   an input pin to receive an input signal;
   a state-detection circuit configured to, upon start-up of the configurable input circuit, provide a binary output signal for determining a state characteristic of the input signal, the state detection circuit having an output that provides at least N−1 output values that make up the binary output signal, the output signal being responsive to the state of the input pin and exclusive for each of N different types of input circuits, wherein N is an integer greater than two;

a decoder circuit configured to decode the binary output to determine the state of the input pin and a type of input circuit corresponding to the determined state; and a control circuit configured to power-on the state-detection circuit upon startup of the configurable input circuit, to power-off the state-detection circuit in response to the decoder circuit determining the state of the input signal, and to configure the input circuit for operation based upon the determined state of the input pin.

11. The circuit of claim 10, wherein the state-detection circuit includes a resistor tree divider circuit having output nodes between the respective resistors, the output nodes respectively providing resistance-based voltage values for use by the state-detection circuit in determining the state characteristic.

12. The circuit of claim 10, wherein the state-detection circuit includes a resistor tree divider circuit having output nodes between the respective resistors coupled between a reference voltage and ground, the output nodes respectively providing resistance-based voltage values for use by the state-detection circuit in determining the state characteristic, and at least one comparator connected to the input pin and an output node of the resistor tree divider circuit, the comparator being configured to compare the input signal provided via the input pin with a value at an output node and to provide a compared output value that forms part of the binary output signal.

13. The circuit of claim 10, wherein the state-detection circuit includes a resistor tree divider circuit having output nodes between the respective resistors coupled between a reference voltage and ground, the output nodes respectively providing resistance-based voltage values for use by the state-detection circuit in determining the state characteristic, a switch circuit connected to at least two of the output nodes and configured to provide a switched output corresponding to one of the at least two output nodes, and for each switched output, a comparator connected to the switched output and configured to compare the input signal provided via the input pin with a value at the switched output and to provide a compared output value that forms part of the binary output signal.

14. The circuit of claim 10, further comprising at least one additional input pin configured to receive a different input signal, the state-detection circuit being configured to provide the output signal in response to the state of the input pins.

15. The circuit of claim 10, wherein the state-detection circuit is configured to provide different output values that are dependent upon the presence of a resistor coupled between the input pin and at least one of a source and ground.

16. A method for operating an input circuit, the method comprising:

receiving an input signal at an input pin;

in response to a startup condition, powering a state-detection circuit to provide a binary output signal for determining a state characteristic of the input signal, the state detection circuit providing an output having at least N−1 output values that make up the binary output signal, the output signal being responsive to the state of the input pin and exclusive for each of N different types of input circuits;

in a decoder circuit, decoding the binary output to determine the state of the input pin and a type of input circuit corresponding to the determined state; and in response to determining the state of the input signal, power-off the state-detection circuit.

17. The method of claim 16, further including configuring the input circuit for operation based upon the determined state of the input pin.

18. The method of claim 16, further including using a resistor tree divider circuit having output nodes between the respective resistors to provide resistance-based voltage values, and in the state-detection circuit, comparing the provided resistance-based voltage values to the signal at the input pin to determine the state of the input pin.

19. The method of claim 16, further including using a resistor tree divider circuit having output nodes between the respective resistors to provide resistance-based voltage values, and selectively providing values of the output nodes to a comparator circuit, and in the comparator circuit, respectively comparing the input signal to the provided value from each of the output nodes and providing an output for each comparison to form the binary output.

20. The method of claim 16, further comprising receiving an input signal at an additional input pin, and wherein providing an output having at least N−1 output values that make up the binary output signal includes providing output values for each input pin that combine to set an output signal that is exclusive for each of N×N different types of input circuits.

* * * * *